United States Patent [19]
Michon

[11] Patent Number: 5,719,489
[45] Date of Patent: Feb. 17, 1998

[54] APPARATUS FOR DETERMINING LOAD CURRENTS

[75] Inventor: Gerald John Michon, Waterford, N.Y.

[73] Assignee: General Electric Company, Schenectady, N.Y.

[21] Appl. No.: 698,701

[22] Filed: Aug. 16, 1996

[51] Int. Cl.$^6$ .................................................. G05F 1/70
[52] U.S. Cl. ............................................................ 323/215
[58] Field of Search ..................................... 323/205, 207, 323/212, 215, 211; 361/76, 87; 307/127

[56] References Cited

U.S. PATENT DOCUMENTS

| | | | |
|---|---|---|---|
| 3,959,720 | 5/1976 | Bose et al. | 323/102 |
| 4,068,159 | 1/1978 | Gyugyi | 323/119 |
| 4,092,592 | 5/1978 | Milkovic | 324/142 |
| 4,447,843 | 5/1984 | Massey | 361/76 |
| 4,799,005 | 1/1989 | Fernandes | 324/127 |
| 5,198,746 | 3/1993 | Gyugyi et al. | 323/207 |
| 5,499,155 | 3/1996 | Gershen et al. | 361/113 |

*Primary Examiner*—Adolf Berhane
*Attorney, Agent, or Firm*—Tyler Maddry; Donald S. Ingraham

[57] ABSTRACT

A compact power circuit configured for circuit breaker applications includes, in one embodiment, a plurality of current transformers, each current transformer being coupled to a respective one of the phase lines of a power line to generate a current proportional to the current in the respective one of the phase lines. The circuit also includes a plurality of operational amplifiers, each of the operational amplifiers being coupled to a respective one of the current transformers. The operational amplifiers generate the phase signals $v_a$, $v_b$ and $v_c$ respectively. A neutral phase signal Vn is generated by a current transformer coupled to the neutral phase line of the power line. A ground fault signal is generated from the vector sum of signals $v_a$, $v_b$, $v_c$ and $V_n$.

16 Claims, 3 Drawing Sheets

APPARATUS FOR DETERMINING LOAD CURRENTS

FIELD OF THE INVENTION

This invention relates to circuit breaker power metering and fault detection and, more particularly, to generating signals representative of phase currents supplied to a load.

BACKGROUND OF THE INVENTION

To detect a fault or other condition under which a circuit breaker should be tripped, typical circuit breakers include a microcontroller and a power circuit for generating signals representative of currents supplied to a load. The microcontroller and power circuit may be housed in a case. With respect to the power circuit, and in a three-phase system, three separate voltages $v_a$, $v_b$, and $v_c$, having magnitudes proportional to the phase currents, are generated. A voltage $v_{gf}$ proportional to the ground fault current also typically is generated.

The generated voltages $v_a$, $v_b$, $v_c$ and $v_{gf}$ are supplied to the microcontroller, which may be implemented as an application specific integrated circuit (ASIC). The microcontroller is programmed to process such input voltage signals to control tripping of the brewer and also for performing power metering functions, e.g., measure current, power, and phase angle.

The power required by the microcontroller typically is provided from the power lines coupled to the breaker. Therefore, in addition to generating voltages $v_a$, $v_b$, $v_c$ and $v_{gf}$, the power circuit also provides the rated voltage supply to the microcontroller.

In at least one known circuit breaker, the power circuit and microcontroller are required to respond to a fault within one half cycle of the 50/60 Hz. cycle fault current. This requirement means that the power circuit must generate the power supply voltage and voltages $v_a$, $v_b$, $v_c$ and $v_{gf}$ within one half cycle of the load current. The known circuit breaker which satisfies these requirements includes a power circuit having four primary current transformers for generating signals proportional to the three phase currents and a neutral current. Four secondary current transformers, coupled to the primary current transformers, are used for generating four voltage signals $v_a$, $v_b$, $v_c$ and $v_{gf}$ proportional to the three phase currents and the ground fault current. The current transformers are typically connected in a "WYE" configuration. The power circuit also includes a three-phase bridge rectifier to generate the power supply voltage.

In the known circuit breaker described above, it would be desirable to add a display, coupled to the microcontroller, for displaying metering quantities. Although adding a display is desirable, in the above-described circuit breaker the components of the power circuit and the microcontroller occupy substantially the entire internal volume of the circuit breaker case. Reconfiguring the case to be larger so that a display can be incorporated into the circuit breaker, however, increases costs.

It would be desirable, therefore, to provide a more compact power circuit for a circuit breaker so that additional components, such as a light-emitting diode (LED) display, can be added to the circuit breaker without having to reconfigure the case, such as by enlargement. In addition, to at least partially offset the costs of the added components, e.g., an LED display, it would be desirable to reduce the cost of the power circuit by eliminating several of its components. Of course, such a compact, reduced cost power circuit must also satisfy the power circuit requirements, e.g., generate the power supply voltage and voltages $v_a$, $v_b$, $v_c$ and $v_{gf}$ within one half cycle of the load current.

SUMMARY OF THE INVENTION

The foregoing and other objects may be attained by a compact power circuit configured for circuit breaker applications. In one embodiment of the present power circuit, no secondary current transformers are utilized, eliminating the costs and space requirements associated with such secondary current transformers.

More particularly, a power circuit in accordance with one embodiment of the present invention includes center-tapped line current, or primary, transformers and a neutral current, or primary, transformer. Each primary current transformer is coupled to a respective power line. Current developed in each primary current transformer is supplied, via bias resistors, to respective operational amplifiers (op amps). Each op amp produces a respective output signal $v_a$, $v_b$, $v_c$ proportional to the associated line current. The primary current transformers are also coupled to a three-phase bridge rectifier.

The neutral line current is developed from the neutral current transformer. A neutral voltage $v_n$, and voltages $v_a$, $v_b$, $v_c$ are supplied to a summing op amp. In operation, a voltage $v_{gf}$ proportional to the ground fault current is generated from the vector sum of four input voltages $v_a$, $v_b$, $v_c$, and $v_n$.

Voltages $v_a$, $v_b$, $v_c$ and $v_{gf}$ are supplied to the circuit breaker microcontroller which uses these voltages in detecting faults as well as determining metering quantities.

The above described power circuit responds to a fault within one half cycle of the 50/60 Hz cycle fault current. In addition, the power circuit generates a power signal +V required to energize the circuit breaker microcontroller. Further, the power circuit is more compact than known power circuits, since it utilizes no secondary current transformers. Therefore, when the power circuit is mounted in the unmodified circuit breaker case initially configured to house the known power circuit, there is space for additional components, such as a display.

DETAILED DESCRIPTION OF THE DRAWINGS

Figure 1:
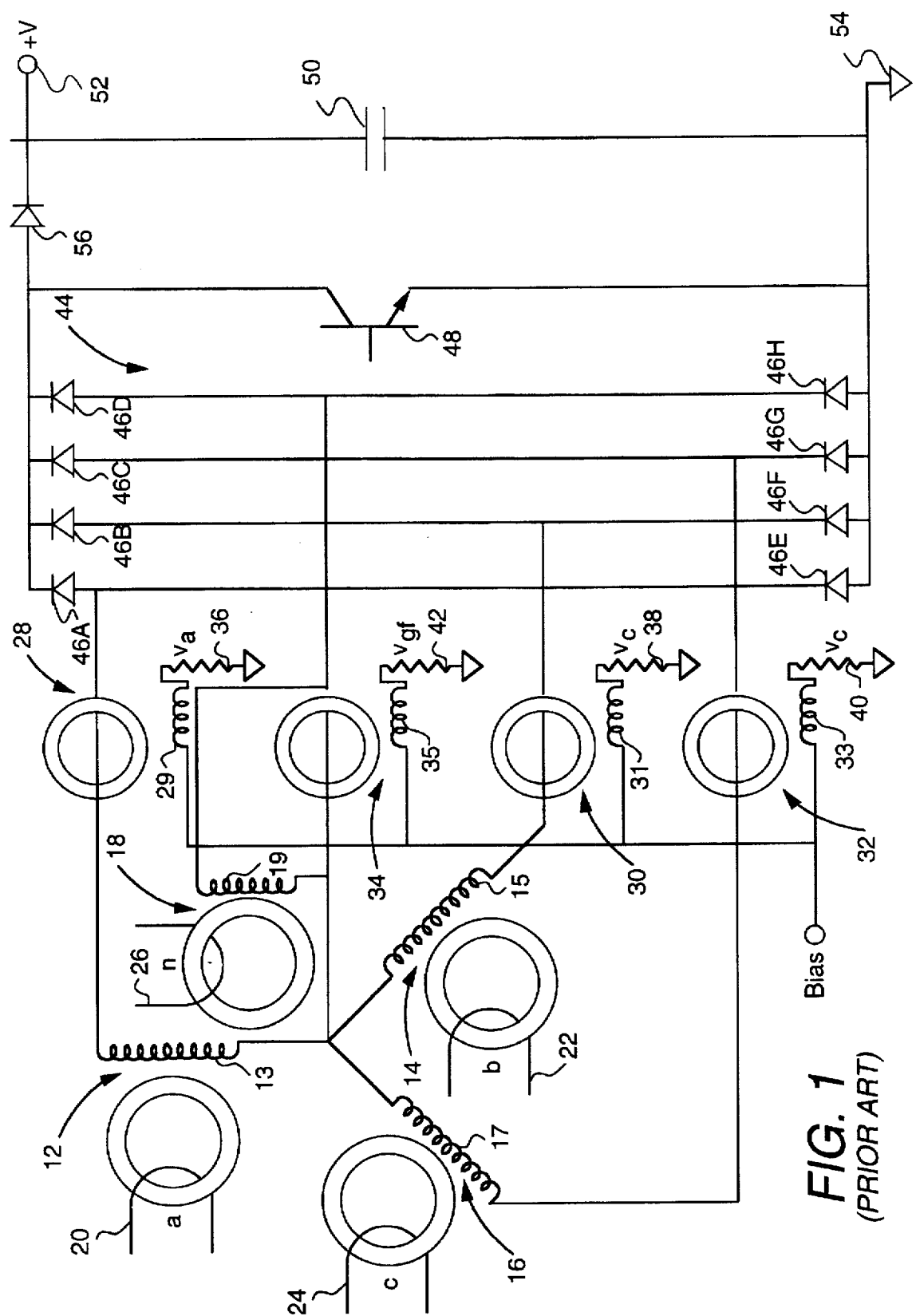
FIG. 1 is a schematic illustration of a known power circuit for a circuit breaker.

FIG. 1 illustrates a prior art power circuit 10 for a circuit breaker including line current, or primary, transformers 12, 14 and 16 and a neutral current, or primary, transformer 18 connected in a WYE configuration. Each primary transformer 12, 14, 16 and 18 is coupled to a respective power line 20, 22, 24 and 26. The current developed in the output winding 13, 15, 17 and 19 of each respective primary transformer 12, 14, 16 and 18 is supplied to respective secondary current transformers 28, 30, 32 and 34 having output windings 29, 31, 33 and 35, respectively. Resistors 36, 38, 40 and 42 are coupled between one side of the respective secondary current transformer output windings 29, 31, 33 and 35 and ground. Each primary current transformer output winding 13, 15, 17 and 19 is also coupled to a pair of diodes 46A and 46E, 46B and 46F, 46C and 46G, and 46D and 46H, respectively, of a three-phase bridge rectifier 44.

A discharge capacitor 50 is coupled across output terminal 52 and ground 54 and in parallel with the series combination of a protection diode 56 and a control transistor 48. Diode 56 is coupled to output terminal 52 and in series with three-phase bridge rectifier 44.

In operation, line currents on power lines 20, 22, 24 and 26 are supplied to primary current transformers 12, 14, 16 and 18. Currents induced in the output windings of primary transformers 12, 14 and 16 are supplied to three-phase bridge rectifier 44. If transistor 48 is low, or in a nonconductive state, a voltage+V is developed at terminal 52 and is supplied to energize the circuit breaker microcontroller (not shown).

In addition, voltages $v_a$, $v_b$, $v_c$ and $v_{gf}$ (where "gf" refers to ground fault) are developed across resistors 36, 38, 40 and 42, respectively, by currents from secondary current transformers 28, 30, 32 and 34, respectively. The magnitude of each of voltages $v_a$, $v_b$, $v_c$ and $v_{gf}$ is proportional to the line current in power line 20, 22, 24 and 26, respectively, and these voltages are supplied to the circuit breaker microcontroller. Using voltages $v_a$, $v_b$, $v_c$ and $v_{gf}$, the microcontroller both detects faults and determines metering quantities.

Voltages $v_a$, $v_b$, $v_c$ and $v_{gf}$ of power circuit 10 respond to a fault within one half cycle of the 50/60 Hz fault current. In addition, power circuit 10 generates the power signal +V required to energize the circuit breaker microcontroller. Therefore, power circuit 10 satisfies the basic circuit breaker requirements but nevertheless occupies a large volume in the circuit breaker case (not shown). Therefore while adding a display to the circuit breaker using power circuit 10 would be desirable, such display cannot be added without reconfiguring the circuit breaker case and thereby increasing the manufacturing cost of the circuit breaker.

Figure 2A:
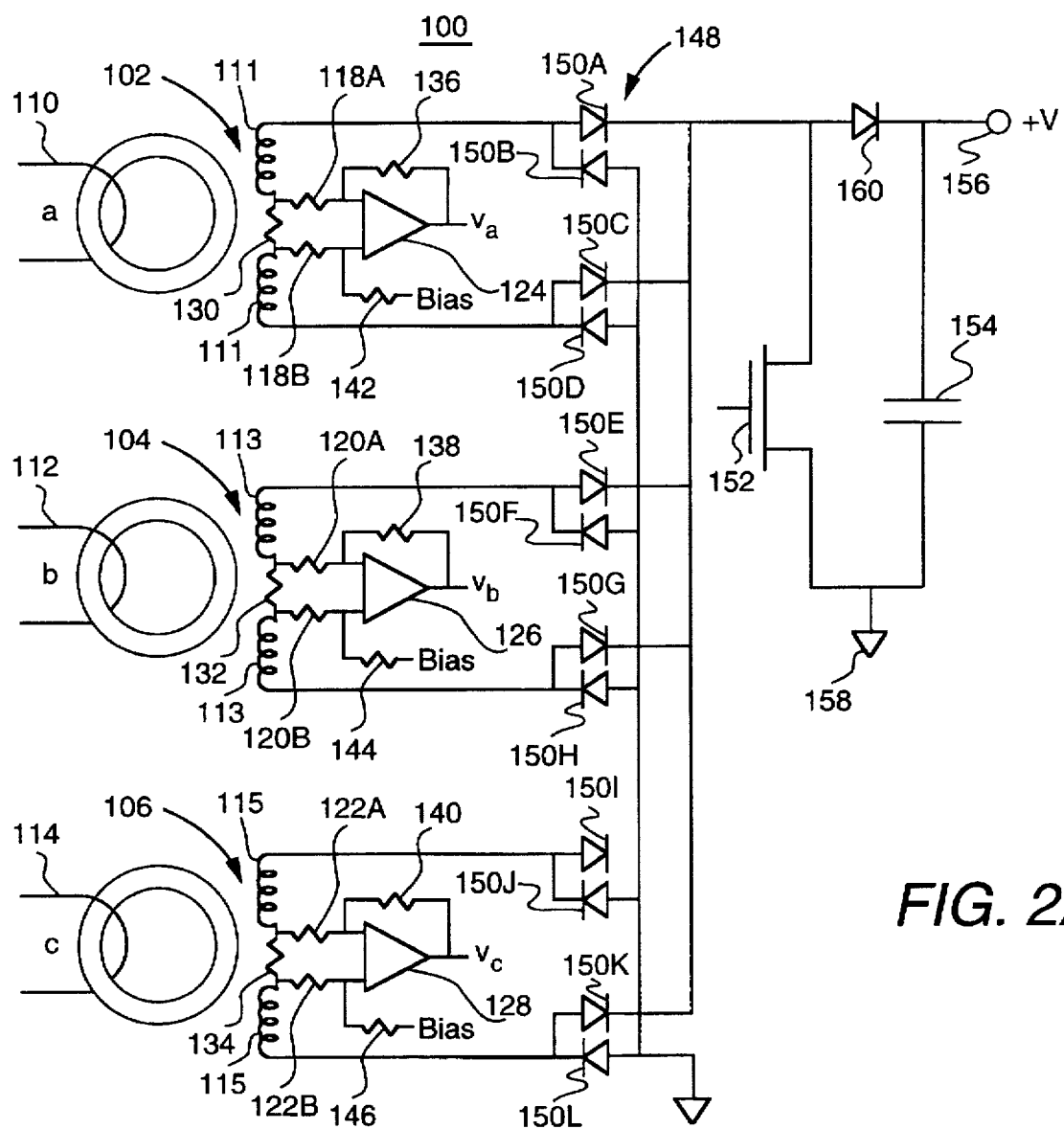
FIGS. 2A, 2B and 2C are schematic illustrations of a circuit breaker power circuit in accordance with one embodiment of the invention.
Figure 2B:
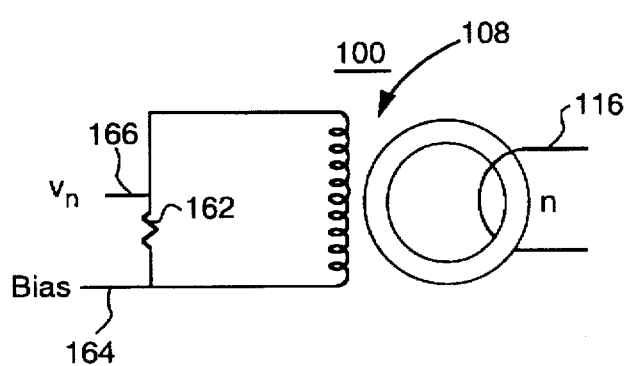
Figure 2C:
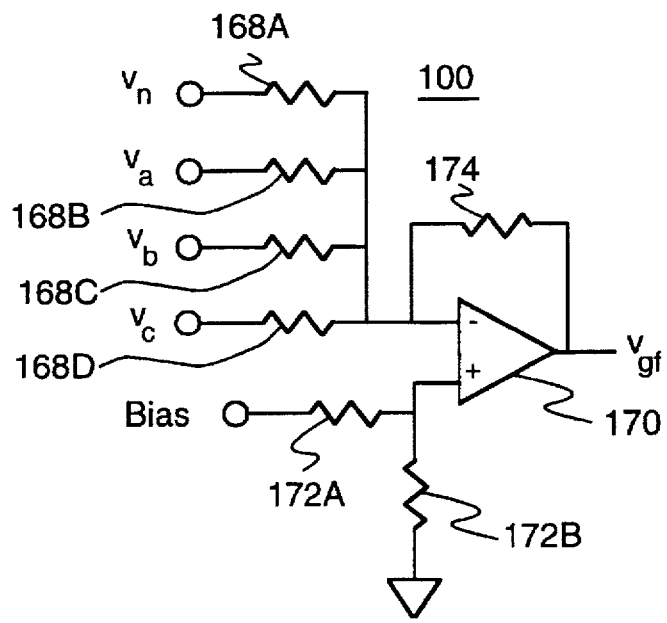

A more compact power circuit 100 in accordance with one embodiment of the invention is illustrated in FIGS. 2A, 2B and 2C. Power circuit 100 is capable of generating voltages $v_a$, $v_b$, $v_c$ and $v_{gf}$ which respond to a fault within one half cycle of the 50/60 Hz hull current and capable of generating the power signal +V required to energize the circuit breaker microcontroller. Further, fewer high cost components are used in power circuit 100 than in power circuit 10.

As shown in FIGS. 2A and 2B, power circuit 100 includes center-tapped line current, or primary, transformers 102, 104 and 106 and a neutral current, or primary, transformer 108. Each primary current transformer 102, 104, 106 and 108 is coupled to a respective power line 110, 112, 114 and 116. The current developed in output windings 111, 113 and 115 of each primary current transformer 102, 104, 106, respectively, is supplied via bias resistances 118A and 118B, 120A and 120B, and 122A and 122B, respectively, to operational amplifiers (op amps) 124, 126 and 128, respectively. In each of primary transformers 102, 104 and 106, output resistances 130, 132 and 134, respectively, electrically connect the two halves of each of windings 111, 113 and 115, respectively, formed by center-tapping the windings, and a voltage proportional to current in windings 111, 113 and 115 is consequently developed across output resistances 130, 132 and 134, respectively. Each op amp 124, 126 and 128 also includes a respective feedback resistance 136, 138 and 140 and is coupled to receive a bias current via bias resistances 142, 144 and 146, respectively.

Primary current transformer windings 111, 113 and 115 are also coupled to a three-phase bridge rectifier 148 which includes diodes 150A–150L. A discharge capacitor 154 is coupled across output terminal 156 and ground 158 and in parallel with the series combination of a protection diode 160 and a control transistor 152. Diode 160 is coupled to output terminal 156 and in series with three-phase bridge rectifier 148.

As shown in FIG. 2B, for the neutral phase primary transformer, a resistance 162 is coupled between a bias current input 164 and voltage $v_n$ output terminal 166. Voltages $v_n$, $v_a$, $v_b$ and $v_c$ are supplied, via respective resistances 168A, 168B, 168D and 168D, as input signals to a summing op amp 170, as shown in FIG. 2C. A bias current is also supplied, via current divider resistances 172A and 172B, to op amp 170. A feedback resistance 174 is coupled between the input and output of op amp 170.

In operation, voltage $v_{gf}$, which is proportional to a ground fault current, is generated from the vector sum of four input voltages $v_a$, $v_b$, $v_c$, and $v_n$. Voltages $v_a$, $v_b$, and $v_c$ are output voltages of op amps 124, 126 and 128, respectively. Voltages $v_a$, $v_b$, $v_c$ and $v_{gf}$ are supplied to the circuit breaker microcontroller (not shown). Using voltages $v_a$, $v_b$, $v_c$ and $v_{gf}$, the microcontroller both detects faults and determines metering quantities.

Power circuit 100 responds to a fault within one half cycle of the 50/60 Hz fault current and, in addition, generates the power signal +V required to energize the circuit breaker microcontroller. Therefore, power circuit 100 satisfies the basic circuit breaker requirements. Further, power circuit 100 is more compact than known power circuit 10, primarily because power circuit 100 employs no secondary current transformers. Therefore, when power circuit 100 is placed in the unmodified circuit breaker case initially configured to house power circuit 10, there remains enough space for additional components, such as a display. Moreover, by avoiding need for secondary current transformers, the cost of power circuit 100 is less than that of power circuit 10.

Figure 3:
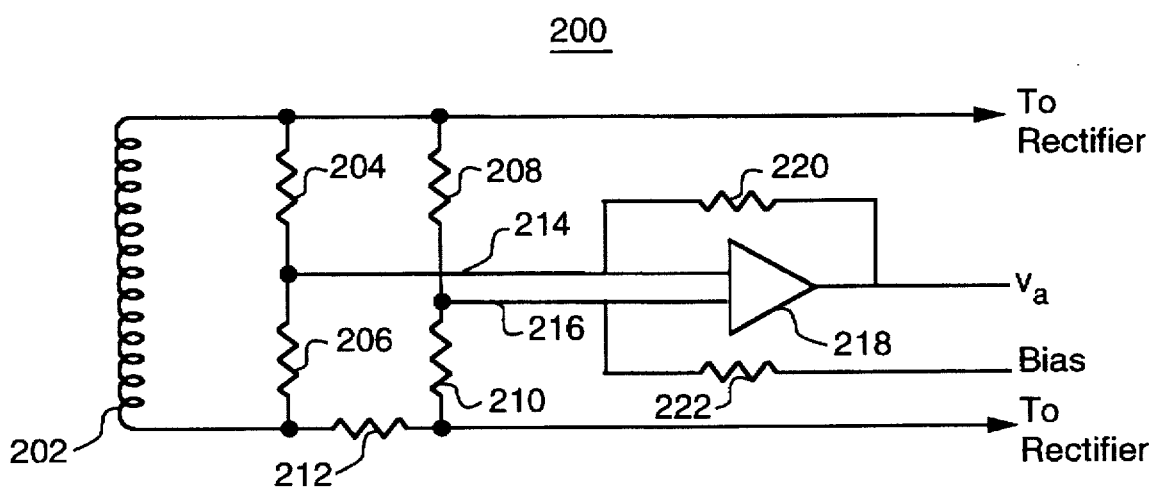
FIG. 3 is a schematic illustration of one phase of a circuit breaker power circuit in accordance with another embodiment of the invention.

An alternative embodiment for the portion of power circuit 100 which generates voltages $v_a$, $v_b$, and $v_c$ is illustrated in FIG. 3. Only one phase 200, i.e., for voltage $v_a$, is shown in FIG. 3. The circuit sections for phases $v_b$ and $v_c$ would be identical to circuit section 200 for voltage $v_a$ shown in FIG. 3. As compared to circuit 100 (FIG. 2A), circuit section 200 advantageously avoids the need to center-tap a primary current transformer, thereby better ensuring the integrity and life of the transformer.

Specifically, power circuit section 200 includes a primary transformer 202 positioned to generate a current proportional to the line current in one phase of a power line. A first pair of series-connected voltage dividing resistances 204 and 206 and a second pair of series-connected voltage dividing resistances 208 and 210 are coupled in parallel across transformer 202. A current sensing resistance 212 is coupled in series with transformer 202 and develops a voltage proportional to the line current. Input signals to op amp 218 are supplied from the junction of the first pair of resistances 204 and 206 and from the junction of the second pair of resistances 208 and 210. Specifically, a voltage proportional to the voltage across current sensing resistance 212 is provided, via leads 214 and 216, to the inputs of op amp 218. A feedback resistance 220 is coupled between the output and input of op amp 218. A bias current is also supplied, via resistance 222, to op amp 218.

In operation, current induced in primary transformer 202 is proportional to current in one phase, e.g., phase a, of the power line. Voltage dividing resistances 204 and 206 and voltage dividing resistances 208 and 210 supply to op amp 218 signals proportional to the induced current, and op amp 218 produces an output signal $v_a$ proportional to such supplied signals. The output signal of op amp 218 is supplied to the circuit breaker microcontroller. In addition, the current induced in transformer 202 is supplied to three phase rectifier 148 (FIG. 2A).

Power circuits 100 and 200 described above are compact and satisfy the operational requirements of a typical circuit breaker, so that they can be used in existing circuit breaker cases along with additional components, such as an LED display, without having to reconfigure the case.

While only certain preferred features of the invention have been illustrated and described, many modifications and changes will occur to those skilled in the art. It is, therefore, to be understood that the appended claims are intended to cover all such modifications and changes as fall within the true spirit of the invention.

What is claimed is:

1. A power circuit for generating signals $v_a$, $v_b$ and $v_c$ proportional to current in respective phase lines of a power line, said power circuit comprising:

a plurality of current transformers, each of said current transformers being coupled to a respective one of the phase lines to generate a current proportional to the current in the phase line; and a plurality of operational amplifiers, each of said operational amplifiers being coupled to a respective one of said current transformers such that respective ones of said operational amplifiers are adapted to generate the signals $v_a$, $v_b$ and $v_c$.

2. The power circuit of claim 1 wherein each of said current transformers includes, respectively, an output winding divided by center-tapping and an output resistance electrically coupling the divided portions of each of said output windings, each respective one of said operational amplifiers having an input coupled to a separate respective one of the output resistances.

3. The power circuit of claim 1 including a respective current sensing resistance coupling each respective one of said output resistances to the input of each respective one of said operational amplifiers.

4. The power circuit of claim 2 further comprising a bridge rectifier, each said portion of each respective one of said output windings being coupled to said bridge rectifier.

5. The power circuit of claim 4 further comprising a control transistor coupled in parallel with said bridge rectifier so that when said transistor is in a nonconductive state, an output voltage is produced by said bridge rectifier.

6. The power circuit of claim 1 wherein said power line includes a neutral phase line, one of said current transformers being coupled to said neutral phase line to develop an output signal $v_n$ proportional to current in the neutral phase power line.

7. The power circuit of claim 6 further comprising a summing operational amplifier coupled to said plurality of operational amplifiers to receive the signals $v_a$, $v_b$ and $v_c$ and coupled to said one current transformer to receive the signal $v_n$, said summing operational amplifier being adapted to produce a signal $v_{gf}$ proportional to a ground limit current from the vector sum of signals $v_a$, $v_b$ and $v_c$ and $v_n$.

8. A power circuit for generating a signal $v_a$ proportional to current in a first power line, said power circuit comprising:

a first current transformer coupled to the first power line to generate a current proportional to the current in the first power line; and a first operational amplifier coupled to said first current transformer, said first operational amplifier being adapted to generate the signal $V_a$.

9. The power circuit of claim 8 wherein said first current transformer includes an output winding divided by center-tapping and an output resistance electrically coupling the divided portions of said output winding, said first operational amplifier having an input coupled to said output resistance.

10. The power circuit recited in claim 8 including a current sensing resistance coupling said output resistance to the input of said first operational amplifier.

11. The power circuit of claim 8 further configured for generating a signal $v_b$ proportional to current in a second power line, said power circuit further comprising:

a second current transformer coupled to the second power line to generate a current proportional to the current in the second power line; and a second operational amplifier coupled to said second current transformer, said second operational amplifier being adapted to generate the signal $v_b$.

12. The power circuit of claim 11 further configured for generating a signal $v_c$ proportional to current in a third power line, said power circuit further comprising:

a third current transformer coupled to the third power line to generate a current proportional to the current in the third power line; and a third operational amplifier coupled to said third current transformer, said third operational amplifier being adapted to generate the signal $V_c$.

13. The power circuit of claim 12 further comprising a bridge rectifier, coupled to each of said first, second and third current transformers.

14. The power circuit of claim 13 further comprising a control transistor coupled in parallel with said bridge rectifier so that when said transistor is in a nonconductive state, an output voltage is produced by said bridge rectifier.

15. The power circuit of claim 12 further configured for generating a signal $v_n$ proportional to current in a neutral power line, said power circuit further comprising a fourth current transformer coupled to the neutral power line and adapted to provide signal $v_n$ as an output signal.

16. The power circuit of claim 15 further comprising a summing operational amplifier coupled to said first, second and third operational amplifiers and to said fourth current transformer to receive the signals $v_a$, $v_b$, $v_c$ and $v_n$, said summing operational amplifier being adapted to produce a signal $v_{gf}$ proportional to a ground fault current from the vector sum of signals $v_a$, $v_b$, $v_c$ and $v_n$.

* * * * *